US012531215B2

(12) United States Patent
Liu et al.

(10) Patent No.: US 12,531,215 B2
(45) Date of Patent: Jan. 20, 2026

(54) PLASMA PROCESSING SYSTEM AND MULTI-SECTION FARADAY SHIELDING DEVICE THEREOF

(71) Applicant: JIANGSU LEUVEN INSTRUMENTS CO. LTD, Jiangsu (CN)

(72) Inventors: Haiyang Liu, Jiangsu (CN); Xiaobo Liu, Jiangsu (CN); Dongdong Hu, Jiangsu (CN); Na Li, Jiangsu (CN); Shiran Cheng, Jiangsu (CN); Song Guo, Jiangsu (CN); Zhihao Wu, Jiangsu (CN); Kaidong Xu, Jiangsu (CN)

(73) Assignee: JIANGSU LEUVEN INSTRUMENTS CO. LTD, Xuzhou (CN)

( * ) Notice: Subject to any disclaimer, the term of this patent is extended or adjusted under 35 U.S.C. 154(b) by 426 days.

(21) Appl. No.: 18/006,485

(22) PCT Filed: Jun. 17, 2021

(86) PCT No.: PCT/CN2021/100681
§ 371 (c)(1),
(2) Date: Jan. 23, 2023

(87) PCT Pub. No.: WO2022/017089
PCT Pub. Date: Jan. 27, 2022

(65) Prior Publication Data

US 2023/0274918 A1 Aug. 31, 2023

(30) Foreign Application Priority Data

Jul. 24, 2020 (CN) ......................... 202010725037.6

(51) Int. Cl.
*H01J 37/32* (2006.01)

(52) U.S. Cl.
CPC .. *H01J 37/32651* (2013.01); *H01J 37/32541* (2013.01); *H01J 37/32568* (2013.01)

(58) Field of Classification Search
CPC ........... H01J 37/32651; H01J 37/32541; H01J 37/32568
(Continued)

(56) References Cited

U.S. PATENT DOCUMENTS

2006/0175016 A1 8/2006 Edamura et al.
2012/0273130 A1 * 11/2012 Drewery ........... H01J 37/32651 156/345.3
(Continued)

FOREIGN PATENT DOCUMENTS

CN 102543636 A 7/2012
CN 103562437 A 2/2014
(Continued)

OTHER PUBLICATIONS

International Search Report and Written Opinion issued in International Application No. PCT/CN2021/100681; mailed Aug. 13, 2021; 10 pgs.

*Primary Examiner* — Parviz Hassanzadeh
(74) *Attorney, Agent, or Firm* — HAUPTMAN HAM, LLP

(57) ABSTRACT

A Faraday shielding device includes an electrically conductive ring and a plurality of electrically conductive petal-shaped assemblies radially and symmetrically on the periphery of the electrically conductive ring. Each electrically conductive petal-shaped assembly includes a plurality of electrically conductive plates and connecting capacitors; the electrically conductive plate are at intervals along the radial direction; a connecting capacitor is between every two adjacent electrically conductive plates. Each connection capacitor includes upper and lower electrode plates, the lower end surface of each upper electrode plate and/or the
(Continued)

upper end surface of each lower electrode plate has an insulating coating, the lower end surface of the upper electrode plate is connected to the upper end surface of the lower electrode plate, the upper electrode plate is electrically connected to one of the adjacent electrically conductive plate, and the lower electrode plate is electrically connected to the other of the adjacent electrically conductive plates.

7 Claims, 3 Drawing Sheets

(58) Field of Classification Search
USPC .......................................... 156/345.3, 345.48
See application file for complete search history.

(56) References Cited

U.S. PATENT DOCUMENTS

| | | | | |
|---|---|---|---|---|
| 2020/0066487 | A1 | 2/2020 | Sakka et al. | |
| 2022/0375733 | A1* | 11/2022 | Liu | H01J 37/32862 |

FOREIGN PATENT DOCUMENTS

| | | | |
|---|---|---|---|
| CN | 103780241 | A | 5/2014 |
| CN | 110491760 | A | 11/2019 |
| JP | 2008159660 | A | 7/2008 |
| JP | 2012185975 | A | 9/2012 |

* cited by examiner

PLASMA PROCESSING SYSTEM AND MULTI-SECTION FARADAY SHIELDING DEVICE THEREOF

RELATED APPLICATIONS

The present application is a U.S. National Phase of International Application Number PCT/CN2021/100681, filed Jun. 17, 2021, and claims priority to Chinese Application Number 202010725037.6, filed Jul. 24, 2020.

TECHNICAL FIELD

The present disclosure relates to the field of semiconductor etching, and in particular to a plasma processing system and a multi-section Faraday shielding device thereof.

BACKGROUND

Patent CN110491760A discloses a Faraday cleaning device and a plasma processing system, as illustrated in FIG. 11, the Faraday cleaning device includes a reaction chamber 3 and a radio frequency coil 4. A dielectric window 301 is arranged above the reaction chamber 3. A nozzle is arranged in the middle of the dielectric window 301; The reaction chamber 3 is provided with a lower electrode 6 for placing the wafer 7. The plasma processing system further includes the Faraday shielding device. The Faraday shielding device is further arranged on the dielectric window 301. The radio frequency coil 4 is arranged on the Faraday shielding device.

In this patent, Farad is divided into sections, these sections are connected with each other through capacitors, so that RF distribution in the entire dielectric window tends to be consistent, so that the entire bottom of the dielectric window is cleaned evenly, which is used to solve the problem that the upper outer edge area of the coupling window at the top of the cavity is cleaned thoroughly, while the middle area is not thoroughly cleaned for the integrated Faraday plate.

However, the existence of capacitive connection makes the Faraday structure occupy more space, and the upper surface is uneven, which increases the difficulty of installing the radio frequency coil; In addition, the installation and positioning of Faraday plate and capacitor are extremely difficult; Moreover, the thickness required by the dielectric layer of the capacitor herein will be lower than 0.1 mm, resulting in a high manufacturing cost.

SUMMARY

In order to solve the above technical problems, the present disclosure is to provide a plasma processing system and a multi-section Faraday shielding device thereof, which has a low processing cost, a simple installation and positioning mode, and does not occupy a vertical space in comparison with the multi-section Faraday shielding device in the prior art.

The technical solutions are as follows. The present disclosure provides a multi-section Faraday shielding device of a plasma processing system including an electrically conductive ring and a plurality of electrically conductive petal-shaped assemblies radially and symmetrically arranged on the outer periphery of the electrically conductive ring; each of the electrically conductive petal-shaped assemblies includes a plurality of electrically conductive plates and a plurality of connecting capacitors; the plurality of electrically conductive plates of each of the electrically conductive petal-shaped assemblies are arranged at intervals along a radial direction; a connecting capacitor is provided between every two adjacent electrically conductive plates; each connection capacitor includes an upper electrode plate and a lower electrode plate, a lower end surface of the upper electrode plate and/or an upper end surface of the lower electrode plate are provided with an insulating coating; the upper electrode plate and the lower electrode plate are parallel to the electrically conductive plate; the lower end surface of the upper electrode plate is connected to the upper end surface of the lower electrode plate, the upper electrode plate is electrically conductively connected to one electrically conductive plate of the two adjacent electrically conductive plates, and the lower electrode plate is electrically conductively connected to another electrically conductive plate of the two adjacent electrically conductive plates; and the plurality of electrically conductive plates are located on the same plane.

Further, the upper end surface of the upper electrode plate is not higher than the upper end surface of the electrically conductive plate; the lower end surface of the lower electrode plate is not lower than the lower end surface of the electrically conductive plate.

Further, the upper electrode plate is bonded and fixed with the lower electrode plate.

Further, outer edges of side walls of the upper electrode plate and the lower electrode plate are bonded and fixed with each other by a colloid.

Provided is a plasma processing system including the above Faraday shielding device.

Further, the plasma processing system further includes an reaction chamber; a dielectric window is arranged above the reaction chamber; the Faraday shielding device is arranged on the dielectric window.

Further, the plasma processing system further includes a radio frequency coil; the radio frequency coil is arranged on the Faraday shielding device.

The beneficial effects of the present disclosure lie in the following. In the present disclosure, the upper electrode plate and the lower electrode plate connected with the capacitor are processed and manufactured integrally with the electrically conductive plate, and the upper electrode plate and the lower electrode plate are processed integrally with the dielectric layer as well, which has a lower processing cost in comparison with the multi-section Faraday shielding device in the prior art; the installation and positioning method of Faraday plate and connecting capacitor is simple, which makes the Faraday multi-section simpler; the vertical space is not occupied in comparison with the multi-section Faraday shielding device in the prior art; and the upper surface of Faraday shielding device is located in a plane, and the location and number of sections are no longer limited by the associated radio frequency coil and dielectric window.

DETAILED DESCRIPTION OF THE EMBODIMENTS

Figure 1:
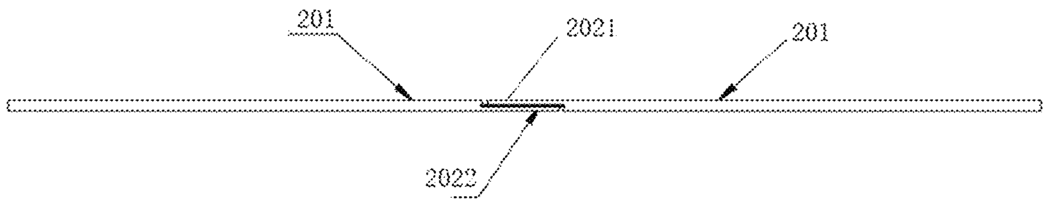
FIG. 1 is a structural diagram of a two-section electrically conductive plates and the connecting capacitor of the present disclosure.
Figure 2:
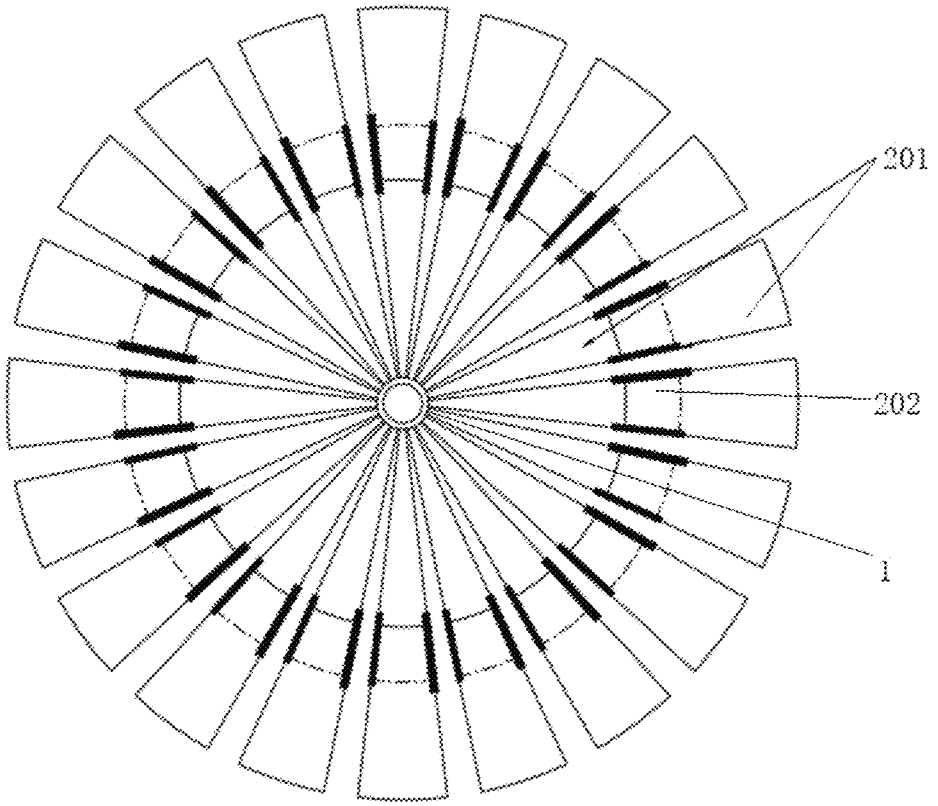
FIG. 2 is a top view of a Faraday shielding device of the present disclosure.
Figure 3:
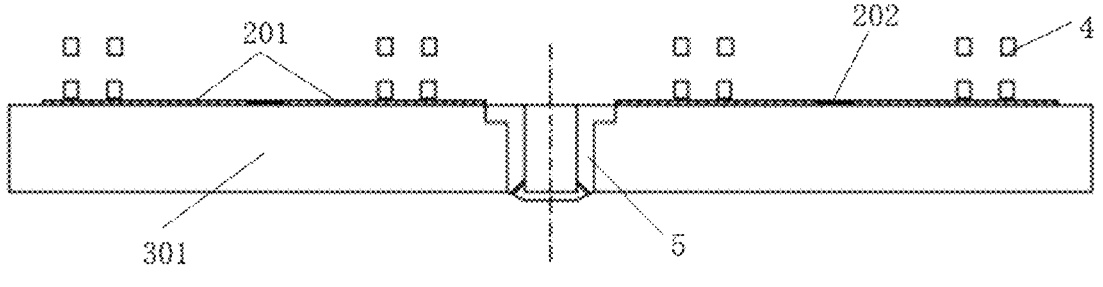
FIG. 3 is a structural diagram of a Faraday shielding device with two-section electrically conductive plates of the present disclosure.

As illustrated in FIGS. 1 and 2, provided is a multi-section Faraday shielding device of a plasma processing system including an electrically conductive ring 1 and a plurality of electrically conductive petal-shaped assemblies radially and symmetrically arranged on the outer periphery of the electrically conductive ring 1; each electrically conductive petal-shaped assembly includes a plurality of electrically conductive plates 201 and a plurality of connecting capacitors 202; the plurality of electrically conductive plate 201 of each electrically conductive petal-shaped assembly are arranged at intervals along the radial direction; a connecting capacitor 202 is provided between every two adjacent electrically conductive plates 201. And the plurality of electrically conductive plates are located on the same plane.

Each connection capacitor 202 includes an upper electrode plate 2021 and a lower electrode plate 2022; the upper electrode plate 2021 and the lower electrode plate 2022 are parallel to the electrically conductive plate 201; the lower end surface of the upper electrode plate 2021 is connected to the upper end surface of the lower electrode plate 2022.

The upper electrode plate 2021 is electrically conductively connected to one electrically conductive plate 201 of the two adjacent electrically conductive plates 201, and the lower electrode plate 202 is electrically conductively connected to another electrically conductive plate 201 of the two adjacent electrically conductive plates 201.

The processing method of the upper electrode plate 2021 and the electrically conductive plates 201 is as follows: a milling machine is used to mill a part of a metal plate to half of the original thickness or slightly less, the milled part is used as the upper electrode plate 2021, and the remaining part is the electrically conductive plate 201. The upper electrode plate 2021 formed by the above processing method is integrally connected with the electrically conductive plate 201, and the processing cost is low.

The processing method of the lower electrode plate 2022 and the electrically conductive plate 201 is the same as above.

The lower end surface of the upper electrode plate 2021 and/or the upper end surface of the lower electrode plate 2022 are provided with an insulating coating. Specifically, the insulating coating can be sprayed by materials such as PTFE and Y2O3, or it can be an oxide layer formed by anodic oxidation or natural color oxidation. The insulating coating serves as a dielectric layer between the upper electrode plate 2021 and the lower electrode plate 2022. The depth of the oxide layer is controllable, and the thickness can be 5 um to 200 um.

Then the lower end face of the upper electrode plate 2021 and the upper end face of the lower electrode plate 2022 are connected with each other, so that the upper end surface of the upper electrode plate 2021 is not higher than the upper end surface of the electrically conductive plate 201; The lower end surface of the lower electrode plate 2022 is not lower than the lower end surface of the electrically conductive plate 201.

The outer edges of side walls of the upper electrode plate 2021 and the lower electrode plate 2022 are bonded and fixed with each other by a colloid.

Provided is a plasma processing system. The system includes an reaction chamber 3 and a radio frequency coil 4, a dielectric window 301 is arranged above the reaction chamber 3; a nozzle is arranged in the middle of the dielectric window 301; the reaction chamber 3 is provided with a lower electrode 6 for placing the wafer 7.

The plasma processing system further includes the above Faraday shielding device; the Faraday shielding device is arranged on the dielectric window 301. The radio frequency coil 4 is arranged on the Faraday shielding device.

Figure 4:
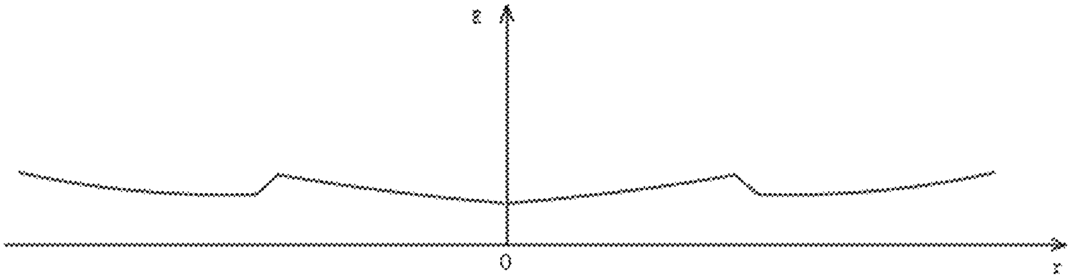
FIG. 4 is a voltage distribution coordinate diagram of a Faraday shielding device with two-section electrically conductive plates of the present disclosure.
Figure 5:
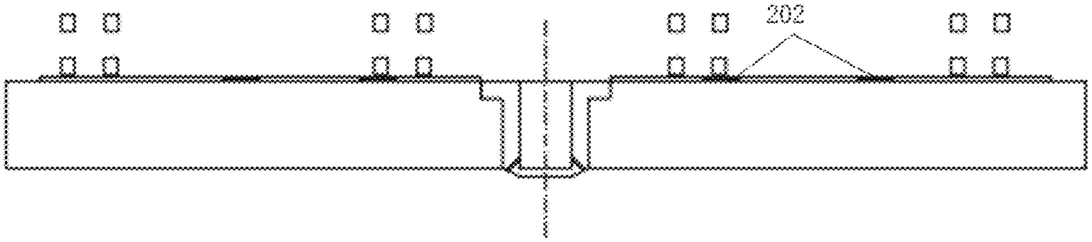
FIG. 5 is a structural diagram of a Faraday shielding device with three-section electrically conductive plates of the present disclosure.
Figure 6:
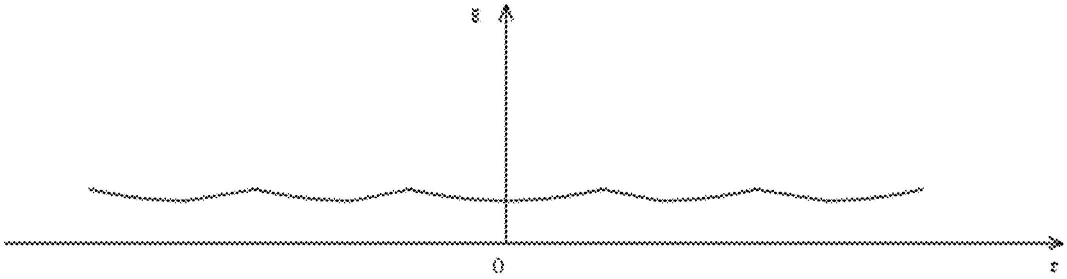
FIG. 6 is a voltage distribution coordinate diagram of a Faraday shielding device with three-section electrically conductive plates of the present disclosure.
Figure 7:
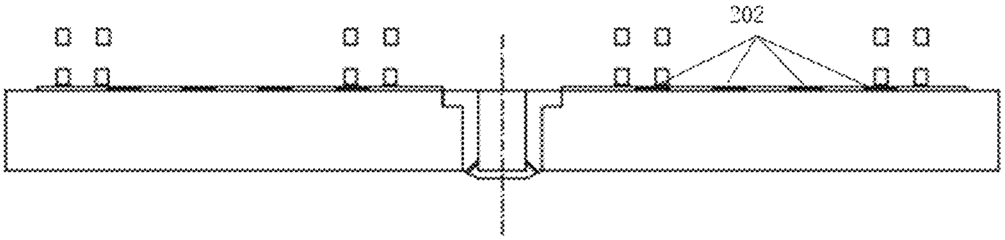
FIG. 7 is a structural diagram of a Faraday shielding device with five-section electrically conductive plates of the present disclosure.
Figure 8:
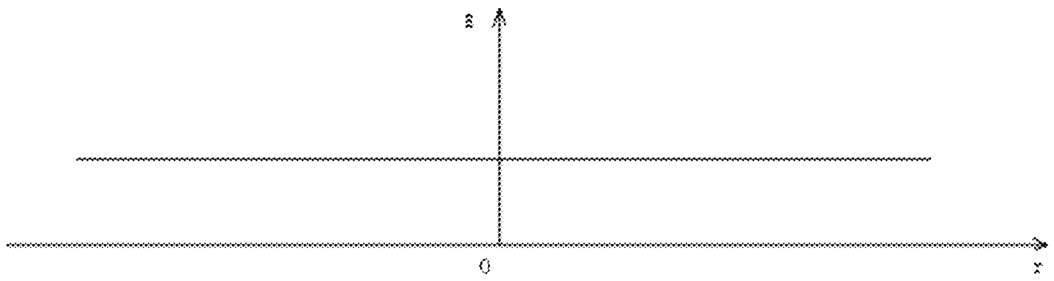
FIG. 8 is a voltage distribution coordinate diagram of a Faraday shielding device with five-section electrically conductive plates of the present disclosure.
Figure 9:
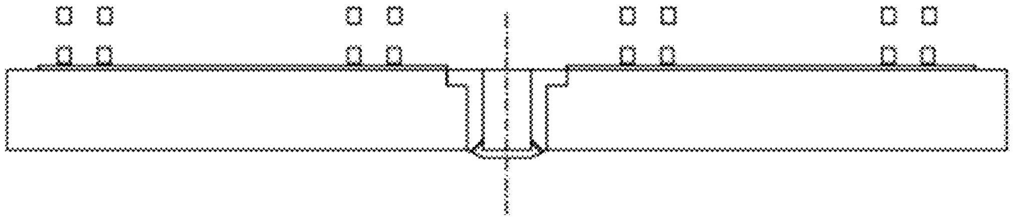
FIG. 9 is a structural diagram of an integrated Faraday shielding device in the prior art.
Figure 10:
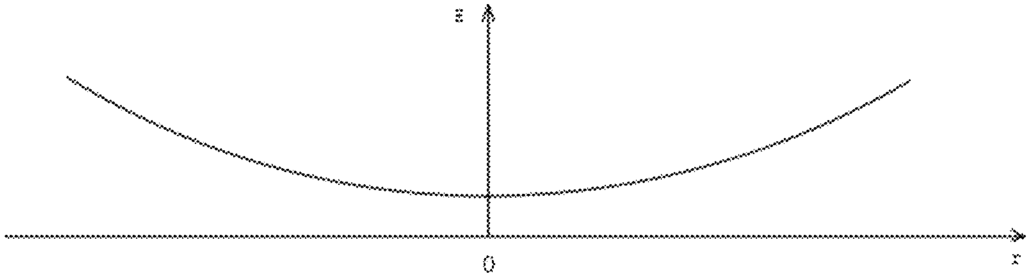
FIG. 10 is a voltage distribution coordinate diagram of an integrated Faraday shielding device in the prior art.
Figure 11:
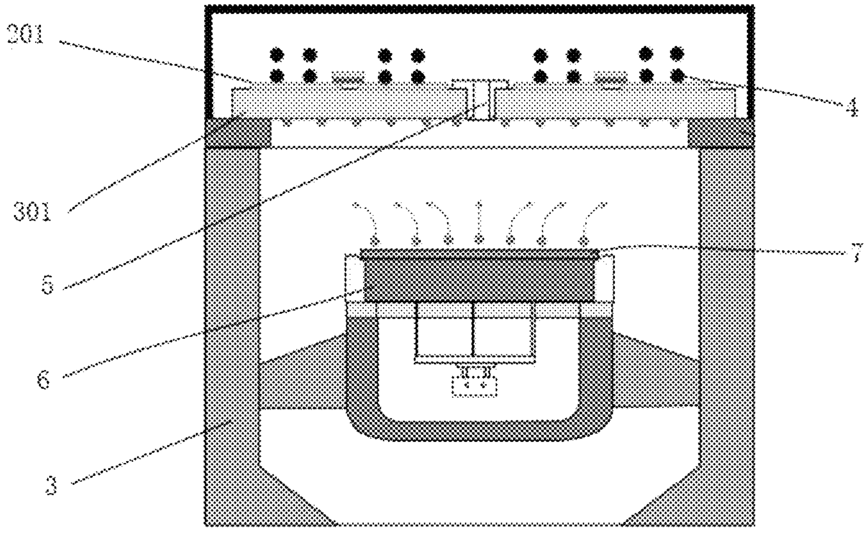
FIG. 11 is a structural diagram of a plasma processing system in the prior art.

FIG. 4 is a voltage distribution coordinate diagram of a Faraday shielding device with two-section electrically conductive plates of the present disclosure; FIG. 6 is a voltage distribution coordinate diagram of a Faraday shielding device with three-section electrically conductive plates of the present disclosure; FIG. 8 is a voltage distribution coordinate diagram of a Faraday shielding device with five-section electrically conductive plates of the present disclosure; FIG. 10 is a voltage distribution coordinate diagram of an integrated Faraday shielding device in the prior art; the far point O is the center of the Faraday shielding device, the abscissa is the distance from the point O, and the ordinate is the corresponding voltage value.

It can be seen from the comparison of the above figures that the voltage distribution of the integrated Faraday shielding device in the dielectric window 301 is concentrated at the edge of the dielectric window 301; with the increase of the number the electrically conductive plates 201, the voltage distribution tends to be consistent, so that the entire bottom of the dielectric window 301 rends to be cleaned evenly.

In the present disclosure, the upper electrode plate 2021 and the lower electrode plate 2022 connected with the capacitor are processed and manufactured integrally with the electrically conductive plate 201, and the upper electrode plate 2021 and the lower electrode plate 2022 are processed integrally with the dielectric layer as well, which has a lower processing cost in comparison with the multi-section Faraday shielding device in the prior art; the installation and positioning method of Faraday plate and connecting capacitor is simple, which makes the Faraday multi-section simple simpler; the vertical space is not considered in comparison with the multi-section Faraday shielding device in the prior art, it does not occupy; the upper surface of the Faraday shielding device is located on a plane, and the location and number of sections are no longer limited by the associated radio frequency coil 4 and the dielectric window 301.

What is claimed is:

1. A multi-section Faraday shielding device of a plasma processing system, comprising an electrically conductive ring and a plurality of electrically conductive petal-shaped assemblies radially and symmetrically arranged on the outer periphery of the electrically conductive ring;

wherein each of the electrically conductive petal-shaped assemblies includes a plurality of electrically conductive plates and a plurality of connecting capacitors; the plurality of electrically conductive plates of each of the electrically conductive petal-shaped assemblies are arranged at intervals along a radial direction; a connecting capacitor is provided between every two adjacent electrically conductive plates; wherein each connecting capacitor includes an upper electrode plate and a lower electrode plate, a lower end surface of the upper electrode plate and/or an upper end surface of the lower electrode plate are provided with an insulating coating; the upper electrode plate and the lower electrode plate are parallel to the electrically conductive plate; the lower end surface of the upper electrode plate is connected to the upper end surface of the lower electrode plate, the upper electrode plate is electrically conductively connected to one electrically conductive plate of two adjacent electrically conductive plates, and the lower electrode plate is electrically conductively connected to another electrically conductive plate of the two adjacent electrically conductive plates; and the plurality of electrically conductive plates are located on a same plane.

2. The multi-section Faraday shielding device of the plasma processing system according to claim 1, wherein the upper end surface of the upper electrode plate is not higher than the upper end surface of the electrically conductive plate; the lower end surface of the lower electrode plate is not lower than the lower end surface of the electrically conductive plate.

3. The multi-section Faraday shielding device of the plasma processing system according to claim 1, wherein the upper electrode plate is bonded and fixed with the lower electrode plate.

4. The multi-section Faraday shielding device of the plasma processing system according to claim 3, wherein outer edges of side walls of the upper electrode plate and the lower electrode plate are bonded and fixed with each other by a colloid.

5. A plasma processing system, comprising the Faraday shielding device according to claim 1.

6. The plasma processing system according to claim 5, further including a reaction chamber; wherein a dielectric window is arranged above the reaction chamber; the Faraday shielding device is arranged on the dielectric window.

7. The plasma processing system according to claim 6, further including a radio frequency coil; wherein the radio frequency coil is arranged on the Faraday shielding device.

* * * * *